(12) United States Patent
Amikura et al.

(10) Patent No.: US 12,040,202 B2
(45) Date of Patent: Jul. 16, 2024

(54) PROCESSING SYSTEM

(71) Applicant: TOKYO ELECTRON LIMITED, Tokyo (JP)

(72) Inventors: Norihiko Amikura, Miyagi (JP); Jun Hirose, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 9 days.

(21) Appl. No.: 17/242,736

(22) Filed: Apr. 28, 2021

(65) Prior Publication Data

US 2021/0343559 A1    Nov. 4, 2021

(30) Foreign Application Priority Data

May 1, 2020  (JP) ................................ 2020-081331

(51) Int. Cl.
  *H01L 21/67*    (2006.01)
  *H01L 21/687*   (2006.01)
  *B25J 9/04*     (2006.01)

(52) U.S. Cl.
  CPC .. *H01L 21/67184* (2013.01); *H01L 21/67167* (2013.01); *H01L 21/67201* (2013.01); *H01L 21/68707* (2013.01); *B25J 9/042* (2013.01)

(58) Field of Classification Search
  CPC ......... H01L 21/67184; H01L 21/67167; H01L 21/67201; H01L 21/68707; H01L 21/67196; H01L 21/67161; H01L 21/67766; B25J 9/042
  See application file for complete search history.

(56) References Cited

U.S. PATENT DOCUMENTS

| | | | |
|---|---|---|---|
| 2005/0098115 A1* | 5/2005 | Barnes | C23C 16/54 118/719 |
| 2006/0021702 A1* | 2/2006 | Kumar | H01L 21/67253 257/E21.252 |
| 2008/0232947 A1* | 9/2008 | van der Meulen | H01L 21/67745 414/805 |
| 2015/0044001 A1* | 2/2015 | Hofmeister | H01L 21/67201 414/217 |
| 2016/0027673 A1* | 1/2016 | Wang | H01L 21/263 156/345.31 |

(Continued)

FOREIGN PATENT DOCUMENTS

| | | |
|---|---|---|
| JP | 2007-511104 A | 4/2007 |
| JP | 2015-508236 A | 3/2015 |

(Continued)

*Primary Examiner* — Glenn F Myers
(74) *Attorney, Agent, or Firm* — XSENSUS LLP (57) ABSTRACT

A processing system capable of increasing an operating time of the processing system is provided. The processing system includes a vacuum transfer module, a plurality of processing modules, a plurality of load-lock modules, and a plurality of atmospheric transfer modules. The vacuum transfer module is configured to transfer a substrate in a pressure lower than an atmospheric pressure. The processing modules are connected to the vacuum transfer module and configured to process the substrate. The load-lock modules are connected to the vacuum transfer module. Each of the atmospheric transfer modules is connected to at least one of the load-lock modules and configured to transfer the substrate in an atmospheric environment.

6 Claims, 5 Drawing Sheets

(56) References Cited

U.S. PATENT DOCUMENTS

2016/0293467 A1\* 10/2016 Caveney ........... H01L 21/67173
2017/0148654 A1\* 5/2017 Paul .................. H01L 21/67389
2017/0263442 A1\* 9/2017 Kang ....................... C23C 16/50

FOREIGN PATENT DOCUMENTS

| JP | 2018-198305 A | 12/2018 |
|---|---|---|
| JP | 2019-26465 A | 2/2019 |
| WO | 2012/098871 A1 | 7/2012 |

\* cited by examiner

PROCESSING SYSTEM

CROSS-REFERENCE TO RELATED APPLICATIONS

This application claims priority to Japanese Patent Application No. 2020-081331, filed on May 1, 2020, the entire contents of which are incorporated herein by reference.

TECHNICAL FIELD

Various aspects and embodiments of the present disclosure relate to a processing system.

BACKGROUND

A substrate processing system including a transfer module, a plurality of processing modules, a plurality of load-lock modules, and a loader module is known (see, e.g., Japanese Patent Application Publication No. 2019-26465).

SUMMARY

The present disclosure provides a processing system capable of increasing an operating time of the processing system.

In accordance with an aspect of the present disclosure, there is provided a processing system including: a vacuum transfer module configured to transfer a substrate in a pressure lower than an atmospheric pressure; a plurality of processing modules connected to the vacuum transfer module and configured to process the substrate; a plurality of load-lock modules connected to the vacuum transfer module; and a plurality of atmospheric transfer modules each of which is connected to at least one of the load-lock modules and configured to transfer the substrate in an atmospheric environment.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of the processing system will be described in detail with reference to the accompanying drawings. The following embodiments are not intended to limit the processing system of the present disclosure.

The components of modules included in the processing system are consumed as they are used, and thus require maintenance. For example, in the substrate processing system disclosed in Japanese Patent Application Publication No. 2019-26465, when the maintenance of the loader module is required, it is not possible to use the loader module under maintenance. In the technique of Japanese Patent Application Publication No. 2019-26465, only one loader module is disposed in the substrate processing system, so that the operation of the entire substrate processing system is stopped when maintenance of the loader module is required. Accordingly, the throughput of the entire substrate processing system decreases.

Therefore, the present disclosure provides a technique capable of increasing the operating time of the processing system.

First Embodiment

<Configuration of Processing System 1>

Figure 1:
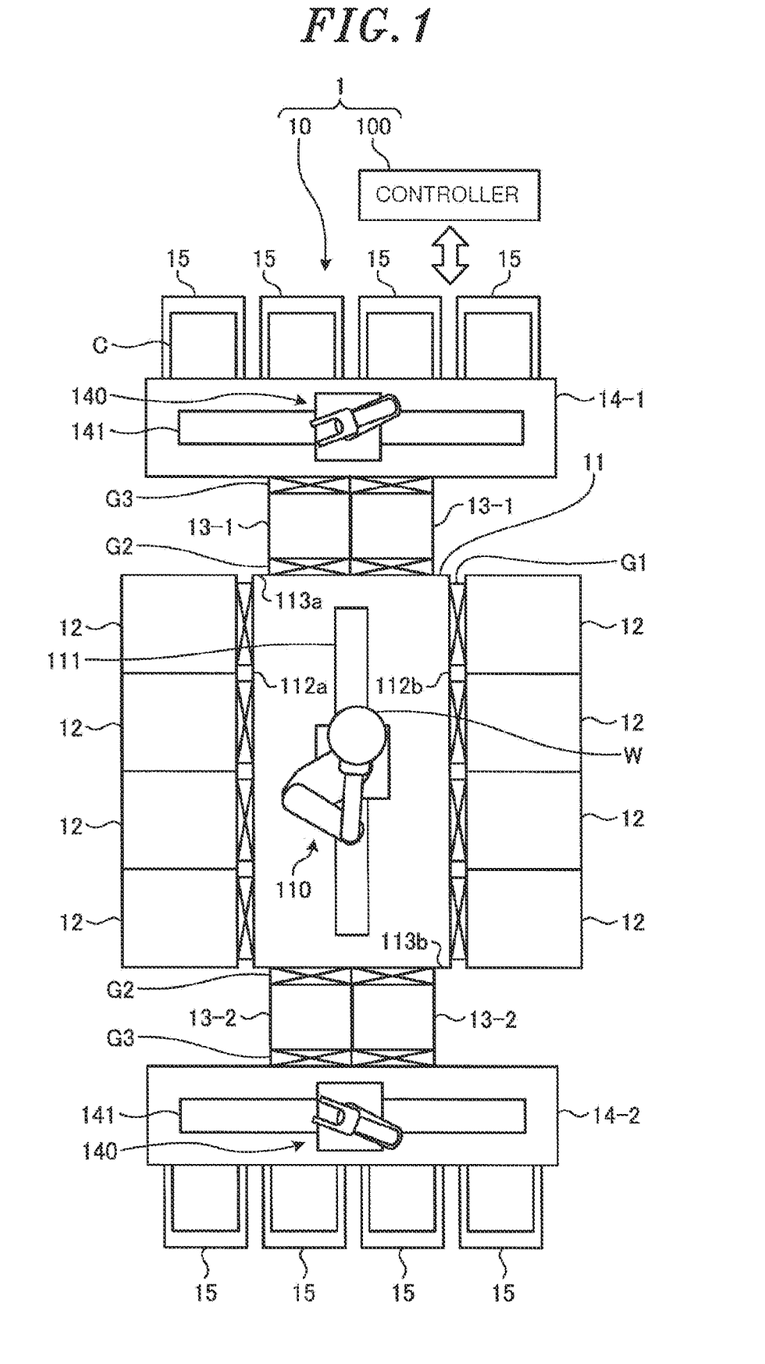
FIG. 1 is a plan view showing an example of a processing system according to a first embodiment.

FIG. 1 is a plan view showing an example of a configuration of a processing system 1 according to a first embodiment. In FIG. 1, internal components of some devices are illustrated transparently for easier understanding. The processing system 1 includes a main body 10 and a controller 100 for controlling the main body 10.

The main body 10 includes a vacuum transfer module 11, a plurality of processing modules 12, a plurality of load-lock modules 13-1 to 13-2, and a plurality of atmospheric transfer modules 14-1 to 14-2. In the following description, the load-lock modules 13-1 to 13-2 will be collectively referred to as "load-lock module 13" unless otherwise stated. Further, in the following description, the atmospheric transfer modules 14-1 to 14-2 will be collectively referred to as "atmospheric transfer module 14" unless otherwise stated.

The plurality of processing modules 12 are connected to a sidewall of the vacuum transfer module 11 through gate valves G1. The vacuum transfer module 11 of the present embodiment has a rectangular outer shape in plan view. The plurality of processing modules 12 are connected to the sidewall of the vacuum transfer module 11 corresponding to the long side of the rectangle through the gate valves G1. In the example of FIG. 1, eight processing modules 12 are connected to the vacuum transfer module 11. Specifically, four processing modules 12 are connected to a sidewall 112a of the vacuum transfer module 11 corresponding to one long side of the rectangle that is the outer shape of the vacuum transfer module 11 in plan view through the gate valves G1. Further, in the example of FIG. 1, four processing modules 12 are connected to a sidewall 112b of the vacuum transfer module 11 corresponding to the other long side facing the one long side of the rectangle through the gate valves G1. The number of the processing modules 12 connected to the vacuum transfer module 11 may be smaller than or equal to seven, or greater than or equal to nine.

Each of the processing modules 12 performs processing such as etching, film formation, or the like on a substrate W. The processing modules 12 may perform the same process or different processes in a manufacturing process.

The plurality of load-lock modules 13 are connected to the other sidewall of the vacuum transfer module 11 through gate valves G2. The plurality of load-lock modules 13 are connected to the sidewall of the vacuum transfer module 11 corresponding to the short side of the rectangle through the gate valves G2. In the example of FIG. 1, four load-lock modules 13 are connected to the vacuum transfer module 11. Specifically, two load-lock modules 13-1 are connected to a sidewall 113a of the vacuum transfer module 11 corresponding to one short side of the rectangle that is the outer shape of the vacuum transfer module 11 in plan view through the gate valves G2. Further, in the example of FIG. 1, two load-lock modules 13-2 are connected to a sidewall 113b of the vacuum transfer module 11 corresponding to the other short side facing the one short side of the rectangle through the gate valves G2. The number of the load-lock modules 13 connected to the vacuum transfer module 11 may be smaller than or equal to three or greater than or equal to five.

Here, as the number of processing modules 12 connected to the sidewalls 112a and 112b of the vacuum transfer module 11 increases, the distance between the load-lock module 13 and each of the processing modules 12 increases. Therefore, the transfer time of the substrate W by a transfer robot 110 increases. Hence, in the processing system 1 of the present embodiment, the plurality of processing modules 12 are connected to the sidewalls 112a and 112b of the vacuum transfer module 11 corresponding to the long sides of the vacuum transfer module 11. Further, the plurality of load-lock modules 13 are connected to the sidewalls 113a and 113b of the vacuum transfer module 11 corresponding to the short sides of the vacuum transfer module 11. Accordingly, in each of the processing modules 12, the substrate W is transferred to and from the load-lock module 13 closer thereto, which makes it possible to suppress the increase in the transfer time of the substrate W even when the number of the load-lock modules 13 increases.

Further, in the processing system 1 of the present embodiment, the plurality of processing modules 12 are connected to the sidewalls 112a and 112b corresponding to the long sides of the vacuum transfer module 11, and the plurality of load-lock modules 13 are connected to the sidewalls 113a and 113b corresponding to the short sides of the vacuum transfer module 11. Accordingly, the vacuum transfer module 11, the plurality of processing modules 12, the plurality of load-lock modules 13, and the plurality of atmospheric transfer modules 14 can be efficiently arranged, and the installation area of the processing system 1 can be reduced.

The transfer robot 110 and a guide rail 111 are disposed in the vacuum transfer module 11. The transfer robot 110 moves along the guide rail 111 in the vacuum transfer module 11 to transfer the substrate W between the load-lock module 13 and the processing module 12 and between the processing modules 12. A pressure in the vacuum transfer module 11 is maintained at a predetermined pressure (hereinafter referred to as "low pressure") lower than an atmospheric pressure.

One sidewall of each load-lock module 13 is connected to the vacuum transfer module 11 through the gate valve G2, and the other sidewall of each load-lock module 13 is connected to the atmospheric transfer module 14 through a gate valve G3. The plurality of atmospheric transfer modules 14 is connected to at least one of the plurality of load-lock modules 13.

When the substrate W is loaded into the load-lock module 13 from the atmospheric transfer module 14 through the gate valve G3, the gate valve G3 is closed and the pressure in the load-lock module 13 is decreased from the atmospheric pressure to the low pressure. Then, the gate valve G2 is opened, and the substrate W is transferred from the load-lock module 13 into the vacuum transfer module 11 by the transfer robot 110.

When the substrate W is loaded into the load-lock module 13 from the vacuum transfer module 11 through the gate valve G2 by the transfer robot 110 in a state where the pressure in the load-lock module 13 maintained at the low pressure, the gate valve G2 is closed. Then, the pressure in the load-lock module 13 is increased from the low pressure to the atmospheric pressure. Then, the gate valve G3 is opened, and the substrate W is transferred from the load-lock module 13 into the atmospheric transfer module 14.

A plurality of load ports 15 is disposed on a sidewall of the atmospheric transfer module 14 opposite to the sidewall where the gate valves G3 are disposed. A container C such as a front opening unified pod (FOUP) or the like capable of accommodating a plurality of substrates W is connected to each load port 15. The atmospheric transfer module 14 may be provided with an aligner module for changing the orientation of the substrate W.

A transfer robot 140 and a guide rail 141 are disposed in the atmospheric transfer module 14. The pressure in the atmospheric transfer module 14 is maintained at the atmospheric pressure. The transfer robot 140 moves along the guide rail 141 in the atmospheric transfer module 14 to transfer the substrate W between each load-lock module 13 and each load port 15. A fan filter unit (FFU) or the like is disposed at an upper portion of the atmospheric transfer module 14 so that air from which particles and the like are removed is supplied into the atmospheric transfer module 14 to generate downflow in the atmospheric transfer module 14. In the present embodiment, the pressure in the atmospheric transfer module 14 is maintained in an atmospheric environment. However, in another embodiment, the pressure in the atmospheric transfer module 14 may be controlled to a positive pressure. Accordingly, it is possible to suppress intrusion of particles and the like from the outside into the atmospheric transfer module 14.

In the processing system 1 of the present embodiment, the plurality of atmospheric transfer modules 14 are connected to the vacuum transfer module 11 through the load-lock modules 13. Further, each of the atmospheric transfer modules 14 can perform loading and unloading of the substrate W. Therefore, even if the maintenance of one atmospheric transfer module 14 is required, the processing of the substrate W can be continued using the other atmospheric transfer module 14. If the maintenance of the atmospheric transfer module 14 is completed while the substrate W is being processed using the other atmospheric transfer module 14, the processing performance of the substrate W can be restored to a normal state again. As described above, even when the maintenance of one atmospheric transfer module 14 is required, the processing system 1 of the present embodiment can continue the processing of the substrate W using the other atmospheric transfer modules 14. Accordingly, the operating time of the processing system 1 can be increased, and the decrease in the throughput of the entire processing system 1 can be suppressed.

The substrate W transferred from one atmospheric transfer module 14 to the vacuum transfer module 11 through the load-lock module 13 may be unloaded to the other atmospheric transfer module 14 through the load-lock module 13.

The controller 100 includes a memory, a processor, and an input/output interface. A program or data such as a recipe or the like is stored in the memory. The memory is, e.g., a random access memory (RAM), a read only memory (ROM), a hard disk drive (HDD), a solid state drive (SSD), or the like. The processor controls individual components of the main body 10 through the input/output interface based on the data such as the recipe stored in the memory by executing the program read out from the memory. The processor is a central processing unit (CPU), a digital signal processor (DSP), or the like.

As described above, the processing system 1 of the first embodiment includes the vacuum transfer module 11, the plurality of processing modules 12, the plurality of load-lock modules 13, and the plurality of atmospheric transfer modules 14. The vacuum transfer module 11 transfers the substrate W in a pressure lower than the atmospheric pressure. The plurality of processing modules 12 are connected to the vacuum transfer module 11 to process the substrate W. The plurality of load-lock modules 13 are connected to the vacuum transfer module 11. The plurality of atmospheric transfer modules 14 transfer the substrate W in an atmospheric environment. Further, each of the atmospheric transfer module 14 is connected to at least one of the plurality of load-lock modules 13. Accordingly, the operating time of the processing system 1 can be increased.

In the first embodiment, the vacuum transfer module 11 has a rectangular outer shape in plan view. Further, at least one of the load-lock modules 13 is connected to the sidewall 113a of the vacuum transfer module 11 corresponding to one short side of the rectangle, and at least another one of the load-lock modules 13 is connected to the sidewall 113b corresponding to the other short side facing the one short side of the rectangle. Further, at least one of the plurality of atmospheric transfer modules 14 is connected to the load-lock module 13 connected to the sidewall 113a of the vacuum transfer module 11 corresponding to one short side, and at least another one of the atmospheric transfer modules 14 is connected to the load-lock module 13 connected to the sidewall 113b of the vacuum transfer module 11 corresponding to the other short side. Accordingly, it is possible to suppress an increase in the installation area of the vacuum transfer module 11, and also possible to suppress an increase in the transfer time even when the number of the processing modules 12 connected to the vacuum transfer module 11 increases.

Further, in the first embodiment, the container C capable of accommodating a plurality of substrates W is connected to each of the atmospheric transfer modules 14. Each of the atmospheric transfer modules 14 transfers the substrate W accommodated in the container C into the load-lock module 13 and transfers the substrate W that has been transferred from the vacuum transfer module 11 into the load-lock module 13 into the container C. Accordingly, even if the maintenance of any one of the atmospheric transfer modules 14 is required, the substrate W can be loaded and unloaded by the other atmospheric transfer module 14.

Second Embodiment

Figure 2:
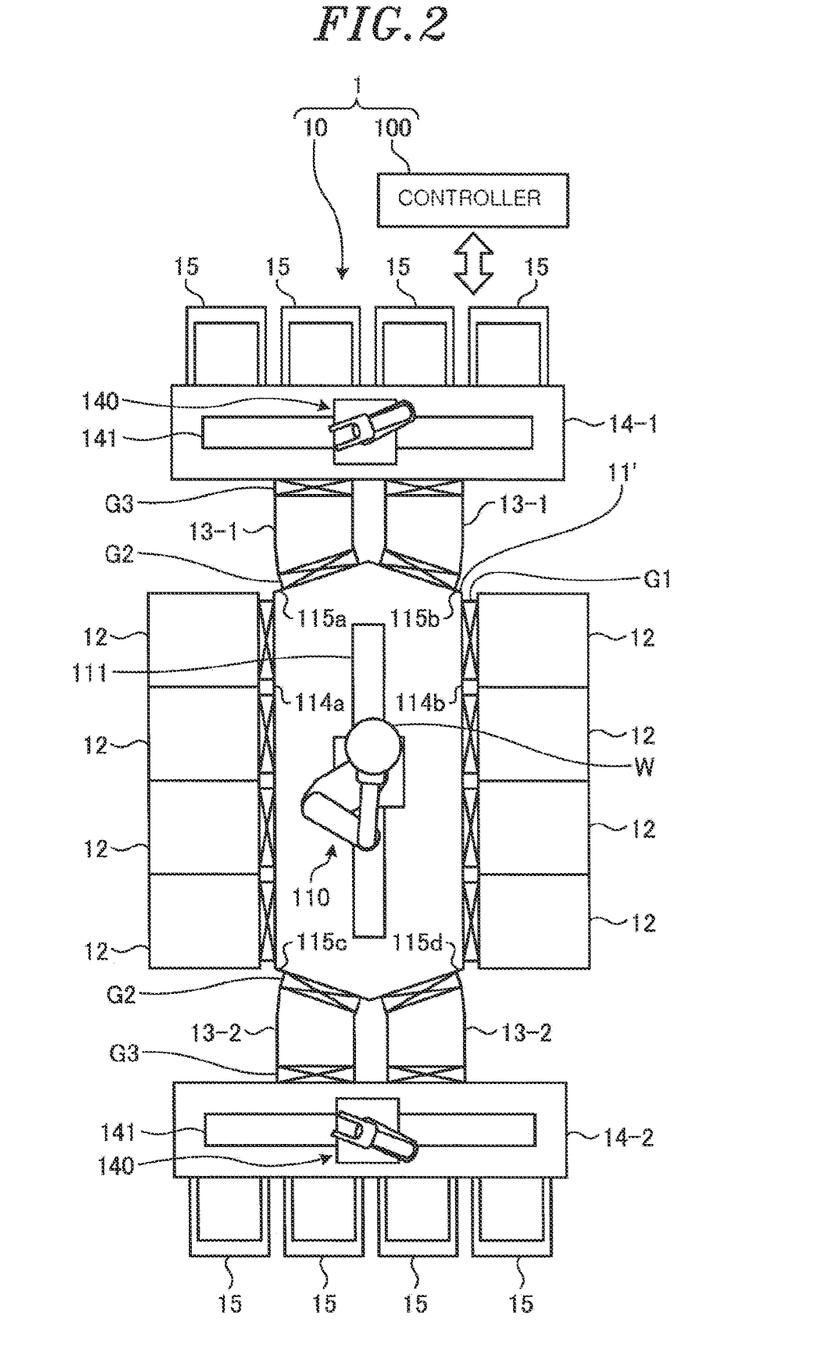
FIG. 2 is a plan view showing an example of a processing system according to a second embodiment.

FIG. 2 is a plan view showing an example of a configuration of a processing system 1 according to a second embodiment. The vacuum transfer module 11 of the first embodiment has a rectangular outer shape in plan view, whereas the vacuum transfer module 11' of the present embodiment has a polygonal shape other than a rectangle in plan view. Since the other configurations in FIG. 2 are the same or similar to the configurations of the same reference numerals shown in FIG. 1 except the following differences, the description thereof will be omitted The main body 10 includes a vacuum transfer module 11', the plurality of processing modules 12, the plurality of load-lock modules 13, and the plurality of atmospheric transfer modules 14. The vacuum transfer module 11' of the present embodiment has a polygonal (hexagonal in the example of FIG. 2) outer shape in plan view. Some of the processing modules 12 are connected to the sidewall 114a of the vacuum transfer module 11' through the gate valves G1, and some other processing modules 12 are connected to the sidewall 114b of the vacuum transfer module 11'. In the example of FIG. 2, four processing modules 12 are connected to each of the sidewalls 114a and 114b through the gate valves G1.

Further, the plurality of load-lock modules 13 are connected to other sidewalls of the vacuum transfer module 11' through gate valve G2. In the example of FIG. 2, one load-lock module 13-1 is connected to each of sidewalls 115a and 115b of the vacuum transfer module 11' through a gate valve G2. Further, in the example of FIG. 2, one load-lock module 13-2 is connected to each of sidewalls 115c and 115d of the vacuum transfer module 11' through the gate valve G2.

The load-lock module 13 may be connected to at least one of the sidewalls 114a and 114b, and the processing module 12 may be connected to at least one of the sidewalls 115a to 115d.

In the processing system 1 of the present embodiment, the atmospheric transfer modules 14 are connected to the vacuum transfer module 11' through the load-lock modules 13, and each of the atmospheric transfer modules 14 can perform loading and unloading of the substrate W. Therefore, even if the maintenance of one atmospheric transfer module 14 is required, the processing of the substrate W can be continued using the other atmospheric transfer module 14.

Third Embodiment

Figure 3:
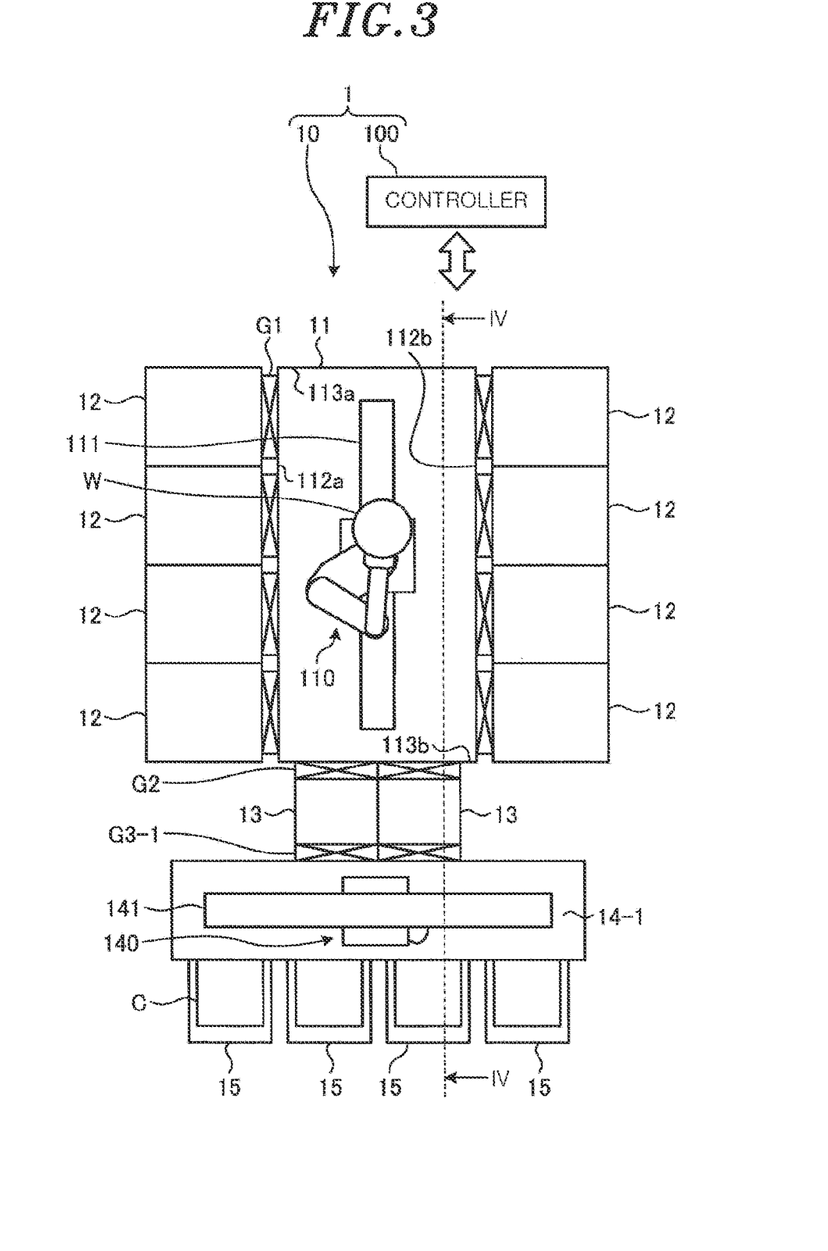
FIG. 3 is a plan view showing an example of a processing system according to a third embodiment.
Figure 4:
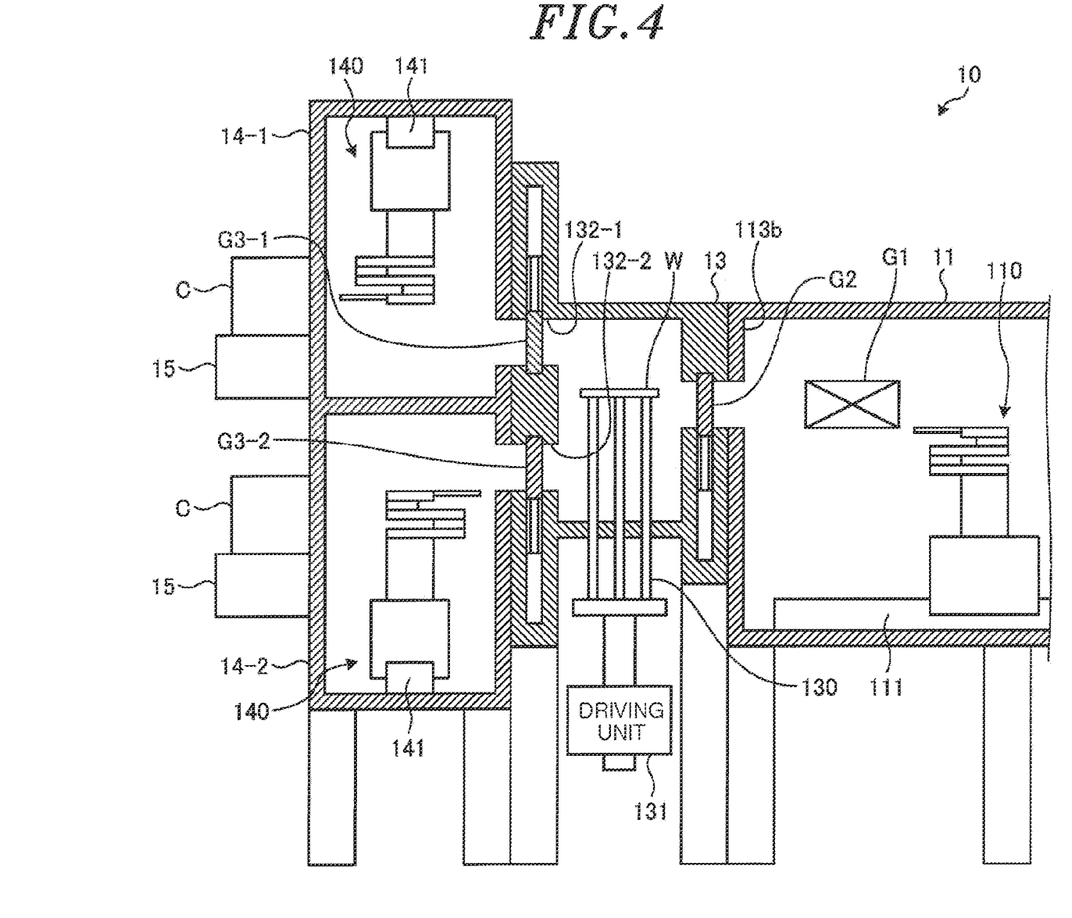
FIG. 4 is a partial cross-sectional view showing an example of a cross section of the processing system shown in FIG. 3 which is taken along a line IV-IV.

FIG. 3 is a plan view showing an example of a configuration of a processing system 1 according to a third embodiment. FIG. 4 is a cross-sectional view showing an example of a cross section of the processing system 1 shown in FIG. 3 which is taken along a line IV-IV. In the processing system 1 of the present embodiment, each atmospheric transfer module 14 is connected to each load-lock module 13. Each atmospheric transfer module 14 can transfer the substrate W to and from each load-lock module 13. Accordingly, even if the maintenance of the atmospheric transfer module 14 and the load-lock module 13 is required, the transfer of the substrate W can be continued using the other atmospheric transfer module 14 and the other load-lock module 13. Since the other configurations in FIGS. 3 and 4 are the same or similar to the configurations of the same reference numerals shown in FIG. 1 except the following differences, the description thereof will be omitted.

The plurality of load-lock modules 13 are connected to the sidewall of the vacuum transfer module 11 through the gate valves G2. In the examples of FIGS. 3 and 4, two load-lock modules 13 are connected to the sidewall 113b of the vacuum transfer module 11 corresponding to the short side of the rectangle through the gate valves G2. In the present embodiment, the two load-lock modules 13 are arranged side by side along the sidewall 113b.

The load-lock modules 13 are connected to the atmospheric transfer modules 14-1 and 14-2 through gate valves G3-1 and G3-2, respectively, as shown in FIG. 4. In the present embodiment, the atmospheric transfer modules 14-1 and 14-2 are stacked vertically along the sidewalls of the load-lock module 13.

Lift pins 130 for holding the substrate W are disposed in each load-lock module 13. The lift pins 130 are raised and lowered by driving a driving unit 131. For example, when the substrate W is transferred between the atmospheric transfer module 14-1 and the load-lock module 13, the lift pins 130 are raised such that tip ends of the lift pins 130 become close to an opening 132-1 that is opened and closed by the gate valve G3-1. Accordingly, the substrate W can be transferred between the lift pins 130 and the transfer robot 140 in the atmospheric transfer module 14-1. Further, when the substrate W is transferred between the atmospheric transfer module 14-2 and the load-lock module 13, the lift pins 130 are lowered such that the tip ends of the lift pins 130 become close to an opening 132-2 that is opened and closed by the gate valve G3-2. Accordingly, the substrate W can be transferred between the lift pins 130 and the transfer robot 140 in the atmospheric transfer module 14-2.

In the processing system 1 of the present embodiment, each atmospheric transfer module 14 can transfer the substrate W to and from each load-lock module 13. Accordingly, even if the maintenance of the atmospheric transfer module 14 and the load-lock module 13 is required, the processing of the substrate W can be continued by using the other atmospheric transfer module 14 and the other load-lock module 13.

Fourth Embodiment

Figure 5:
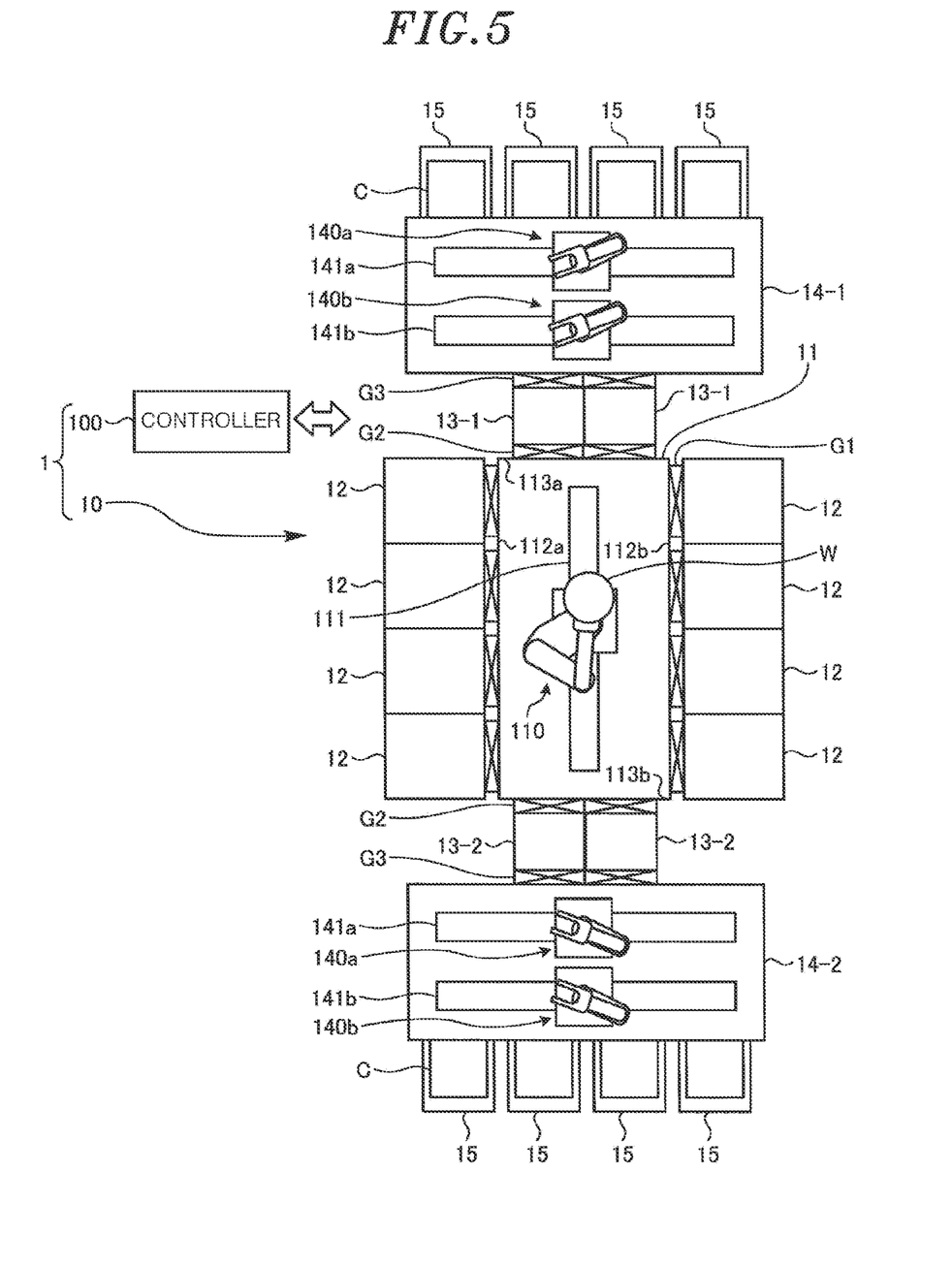
FIG. 5 is a plan view showing an example of a processing system according to a fourth embodiment.

FIG. 5 is a plan view showing an example of a configuration of a processing system 1 according to the fourth embodiment. The processing system 1 of the present embodiment is different from the processing system 1 of the first embodiment in that multiple transfer robots 140a and 140b that operate independently are disposed in each atmospheric transfer module 14. Accordingly, even if one of the transfer robots 140a and 140b in each atmospheric transfer module 14 requires maintenance, the transfer of the substrate W can be continued using the other transfer robot. Since the other configurations in FIG. 5 are the same or similar to the configurations of the same reference numerals shown in FIG. 1 except the following differences, the description thereof will be omitted The transfer robots 140a and 140b, and guide rails 141a and 141b are disposed in each atmospheric transfer module 14. In the following description, the transfer robots 140a and 140b will be collectively referred to as "transfer robot 140" unless otherwise stated. Further, in the following description, the guide rails 141a and 141b will be referred to as "guide rail 141" unless otherwise stated.

The transfer robot 140a moves along the guide rail 141a in the atmospheric transfer module 14 to transfer the substrate W between each load-lock module 13 and each load port 15. The transfer robot 140b moves along the guide rail 141b in the atmospheric transfer module 14 to transfer the substrate W between each load-lock module 13 and each load port 15.

The transfer robots 140a and 140b operate independently. Therefore, even if the maintenance of one transfer robot 140 in each atmospheric transfer module 14 is required, the transfer of the substrate W can be continued using the other transfer robot 140. Accordingly, the operating time of the processing system 1 can be increased, and the decrease in the throughput of the entire processing system 1 can be suppressed.

(Other Applications)

The technique of the present disclosure is not limited to the above-described embodiments, and can be variously modified within the scope of the gist of the present disclosure.

For example, in the first embodiment, the plurality of load-lock modules 13 are connected to the sidewalls 113a and 113b corresponding to the short sides of the vacuum transfer module 11 having a rectangular outer shape in plan view. However, the present disclosure is not limited thereto. For example, at least one of the plurality of load-lock modules 13 may be connected to the sidewall 112a or 112b corresponding to the long side of the vacuum transfer module 11.

In the third embodiment, the plurality of load-lock modules 13 are connected to the sidewall 113b corresponding to the short side of the vacuum transfer module 11 having a rectangular outer shape in plan view. However, the present disclosure is not limited thereto. For example, in another embodiment, the load-lock modules 13 may be connected to the sidewall 113a facing the sidewall 113b, in addition to the sidewall 113b corresponding to the short side of the vacuum transfer module 11. In this case, the atmospheric transfer modules 14 are connected to each load-lock module 13 connected to the sidewall 113a.

In the above-described first to fourth embodiments, one set of the transfer robot 110 and the guide rail 111 is disposed in the vacuum transfer module 11. However, the present disclosure is not limited thereto. For example, in another embodiment, multiple sets of the transfer robot 110 and the guide rail 111 may be disposed in the vacuum transfer module 11. In this case, the transfer robot 110 included in each set operates independently from the transfer robot 110 included in the other sets. Accordingly, even if the transfer robot 110 requires maintenance, the transfer of the substrate W can be continued by another transfer robot 110.

The embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A system for processing comprising:
   a vacuum transfer module configured to transfer a substrate in a pressure lower than an atmospheric pressure;
   a plurality of processing modules connected to the vacuum transfer module and configured to process the substrate;
   a plurality of load-lock modules connected to the vacuum transfer module; and
   a plurality of atmospheric transfer modules each of which is connected to at least one of the load-lock modules and configured to transfer the substrate in an atmospheric environment,
   wherein a first load-lock module of the plurality of load-lock modules is connected to a first sidewall of the vacuum transfer module, and a second load-lock module of the plurality of load-lock modules is connected to a second sidewall of the vacuum transfer module, the first sidewall being different from the second sidewall,
   wherein a first atmospheric transfer module of the plurality of atmospheric transfer modules is connected to the first load-lock module, and a second atmospheric transfer module of the plurality of atmospheric transfer modules is connected to the second load-lock module, the first atmospheric transfer module being different from the second atmospheric transfer module,
   wherein each of the atmospheric transfer modules includes at least one load port for transferring the substrate to and from each of the atmospheric transfer modules so that loading and unloading of the substrate with respect to the vacuum transfer module can be performed by both the first atmospheric transfer module and the second atmospheric transfer module, wherein a container for accommodating multiple substrates is connected to each of the atmospheric transfer modules, and wherein each of the atmospheric transfer modules transfers the substrate accommodated in the container into the load-lock module and transfers the substrate that has been transferred from the vacuum transfer module into the load-lock module into the container.

2. The processing system of claim 1, wherein the vacuum transfer module has an outer shape of polygon in plan view, the first load-lock module is connected to the first sidewall of the vacuum transfer module corresponding to one side of the polygon, the second load-lock module is connected to the second sidewall of the vacuum transfer module corresponding to another side of the polygon, the first atmospheric transfer module is connected to the first load-lock module connected to the first sidewall of the vacuum transfer module corresponding to said one side, and the second atmospheric transfer module is connected to the second load-lock module connected to the second sidewall of the vacuum transfer module corresponding to said another side.

3. The processing system of claim 1, wherein the vacuum transfer module has an outer shape of polygon in plan view, the first load-lock module is connected to the first sidewall of the vacuum transfer module corresponding to one short side of the polygon, the second load-lock module is connected to the second sidewall of the vacuum transfer module corresponding to another short side of the polygon, the first atmospheric transfer module is connected to the first load-lock module connected to the first sidewall of the vacuum transfer module corresponding to said one short side, and the second atmospheric transfer module is connected to the second load-lock module connected to the second sidewall of the vacuum transfer module corresponding to said another short side.

4. The processing system of claim 1, wherein the plurality of atmospheric transfer modules are connected to each of the load-lock modules, and each of the plurality of atmospheric transfer modules transfers the substrate to and from each of the load-lock modules.

5. The processing system of claim 1, wherein the plurality of atmospheric transfer modules are connected to each of the load-lock modules, and each of the plurality of atmospheric transfer modules transfers the substrate to and from each of the load-lock modules.

6. The processing system of claim 1, wherein multiple second transfer robots that transfer the substrate and operate independently of each other are disposed in at least one of the plurality of atmosphere transfer modules.

* * * * *